(12) United States Patent
Hammerschmidt

(10) Patent No.: US 9,817,381 B2
(45) Date of Patent: *Nov. 14, 2017

(54) SENSOR INTERFACE WITH VARIABLE CONTROL COEFFICIENTS

(71) Applicant: Infineon Technologies AG, Neubiberg (DE)

(72) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 120 days.

This patent is subject to a terminal disclaimer.

(21) Appl. No.: 14/867,091

(22) Filed: Sep. 28, 2015

(65) Prior Publication Data

US 2016/0018807 A1 Jan. 21, 2016

Related U.S. Application Data

(63) Continuation of application No. 13/197,288, filed on Aug. 3, 2011, now Pat. No. 9,148,709.

(51) Int. Cl.
*G05B 19/042* (2006.01)
*H04Q 9/00* (2006.01)
(Continued)

(52) U.S. Cl.
CPC .......... *G05B 19/0423* (2013.01); *H04Q 9/00* (2013.01); *H02M 3/33515* (2013.01); *H03M 1/56* (2013.01); *H04Q 2209/80* (2013.01)

(58) Field of Classification Search
CPC .. G05B 19/0423; H04Q 2209/80; H04Q 9/00; H02M 3/33515; H03M 1/56
See application file for complete search history.

(56) References Cited

U.S. PATENT DOCUMENTS 3,761,841 A 9/1973 Jacquart
4,755,816 A 7/1988 DeLuca
(Continued)

FOREIGN PATENT DOCUMENTS

CN 2513286 Y 9/2002
CN 1451140 A 10/2003
(Continued)

OTHER PUBLICATIONS

Non Final Office Action dated Nov. 25, 2015 U.S. Appl. No. 14/248,668.
(Continued)

*Primary Examiner* — Mohamed Barakat
(74) *Attorney, Agent, or Firm* — Eschweiler & Potashnik, LLC

(57) ABSTRACT

The present disclosure is directed towards a sensor interface module that delivers a supply voltage to a plurality of sensors, and which exchanges data signals between the plurality of sensors and a control unit (e.g., an ECU). The sensor interface often employs a single-bit comparator (or a coarse analog to digital converter (ADC), e.g., a 2-bit or 3-bit ADC) to track signals to be exchanged between the sensors and controller over the sensor interface. Compared to power hungry ADC with more bits (e.g., 32 bit ADC), the single-bit comparator/coarse ADC limits hardware complexity and power consumption. In addition, in some embodiments the sensor interface module can include an estimator and assist comparators to speed up the tracking ability of the sensor interface module. In this way, techniques provided herein facilitate reliable, low-power communication between a control unit (e.g., an ECU) and its corresponding sensors.

18 Claims, 6 Drawing Sheets

(51) Int. Cl.
*H02M 3/335* (2006.01)
*H03M 1/56* (2006.01)

(56) References Cited

U.S. PATENT DOCUMENTS

| | | | |
|---|---|---|---|
| 5,468,126 | A | 11/1995 | Lukich |
| 5,550,498 | A | 8/1996 | Kwan et al. |
| 5,659,301 | A | 8/1997 | Berney |
| 5,677,618 | A | 10/1997 | Fiez et al. |
| 5,731,694 | A | 3/1998 | Wilcox et al. |
| 5,742,845 | A | 4/1998 | Wagner |
| 5,946,634 | A | 8/1999 | Korpela |
| 6,064,327 | A | 5/2000 | Ryoho et al. |
| 6,297,691 | B1 | 10/2001 | Anderson et al. |
| 6,362,702 | B1 | 3/2002 | Nielsen et al. |
| 6,407,554 | B1 | 6/2002 | Gadau et al. |
| 6,526,340 | B1 | 2/2003 | Reul et al. |
| 6,556,144 | B1 | 4/2003 | Roberts et al. |
| 6,563,418 | B1 | 5/2003 | Moon |
| 6,608,566 | B1 | 8/2003 | Davis |
| 6,831,431 | B1 | 12/2004 | Dieterle et al. |
| 7,233,645 | B2 | 6/2007 | Feda |
| 7,239,257 | B1* | 7/2007 | Alexander ............ H02M 3/157 341/138 |
| 7,649,345 | B2 | 1/2010 | Kwan |
| 7,773,016 | B2 | 8/2010 | Miao |
| 7,890,666 | B2 | 2/2011 | Gajo et al. |
| 8,497,712 | B2 | 7/2013 | Nguyen et al. |
| 8,710,963 | B2 | 4/2014 | Hammerschmidt |
| 8,805,636 | B2 | 8/2014 | Conner |
| 8,872,392 | B1 | 10/2014 | Gurunathan et al. |
| 9,026,224 | B2 | 5/2015 | Jung et al. |
| 2002/0125872 | A1 | 9/2002 | Groom et al. |
| 2003/0023328 | A1 | 1/2003 | Yasui |
| 2003/0045972 | A1 | 3/2003 | Remboski et al. |
| 2005/0109935 | A1 | 5/2005 | Manlove et al. |
| 2005/0131595 | A1 | 6/2005 | Luskin et al. |
| 2005/0146458 | A1 | 7/2005 | Carmichael et al. |
| 2005/0172058 | A1 | 8/2005 | Brown et al. |
| 2005/0194951 | A1 | 9/2005 | Mehas et al. |
| 2005/0206350 | A1* | 9/2005 | Inokuchi ............. H02P 9/006 322/28 |
| 2006/0129724 | A1 | 6/2006 | Kostadinov |
| 2006/0136601 | A1 | 6/2006 | Arora et al. |
| 2006/0220938 | A1* | 10/2006 | Leung ............. H02M 3/33515 341/155 |
| 2007/0108953 | A1 | 5/2007 | Latham |
| 2007/0239318 | A1 | 10/2007 | Van Ruymbeke et al. |
| 2007/0260438 | A1 | 11/2007 | Langer et al. |
| 2008/0010474 | A1* | 1/2008 | Chapuis ............. H02M 3/157 713/300 |
| 2008/0123815 | A1 | 5/2008 | Feda |
| 2008/0300750 | A1* | 12/2008 | Davis ................ H04B 3/546 701/36 |
| 2008/0310200 | A1 | 12/2008 | Maksimovic et al. |
| 2009/0076760 | A1 | 3/2009 | Schumacher et al. |
| 2009/0205436 | A1 | 8/2009 | Garverick et al. |
| 2009/0237282 | A1 | 9/2009 | Hartlieb et al. |
| 2009/0241499 | A1* | 10/2009 | Maertens ........... A01D 41/1276 56/11.1 |
| 2009/0292414 | A1 | 11/2009 | Raichle et al. |
| 2009/0302815 | A1 | 12/2009 | Tanzawa |
| 2009/0319060 | A1 | 12/2009 | Wojsznis et al. |
| 2010/0264895 | A1 | 10/2010 | Weng et al. |
| 2011/0309916 | A1 | 12/2011 | Mueller et al. |
| 2012/0056642 | A1 | 3/2012 | Song et al. |
| 2012/0081085 | A1 | 4/2012 | Miyamae |
| 2012/0101595 | A1 | 4/2012 | Jung et al. |
| 2012/0110234 | A1 | 5/2012 | Gruber |
| 2012/0153917 | A1* | 6/2012 | Adell ................ H02M 3/1588 323/283 |
| 2012/0212197 | A1 | 8/2012 | Fayed et al. |
| 2012/0249093 | A1 | 10/2012 | Grbo et al. |
| 2012/0307229 | A1 | 12/2012 | Conroy et al. |
| 2013/0033357 | A1 | 2/2013 | Hammerschmidt |
| 2013/0043908 | A1 | 2/2013 | Hammerschmidt |
| 2013/0063166 | A1 | 3/2013 | Ng et al. |
| 2013/0229197 | A1 | 9/2013 | Kusaka et al. |
| 2013/0342185 | A1 | 12/2013 | Kunihiro et al. |
| 2014/0077982 | A1 | 3/2014 | Wu et al. |
| 2014/0266121 | A1 | 9/2014 | Wee et al. |

FOREIGN PATENT DOCUMENTS

| | | | |
|---|---|---|---|
| CN | 101435724 | A | 5/2009 |
| CN | 101806602 | A | 8/2010 |
| CN | 101919148 | A | 12/2010 |
| CN | 201732261 | U | 2/2011 |
| DE | 3912439 | A1 | 10/1990 |
| DE | 4228047 | A1 | 4/1993 |
| DE | 10112844 | A1 | 9/2002 |
| DE | 10340431 | A1 | 4/2004 |
| DE | 102008041030 | A1 | 2/2010 |

OTHER PUBLICATIONS

Non Final Office Action dated Mar. 11, 2016 U.S. Appl. No. 14/478,073.
Notice of Allowance dated May 26, 2016 U.S. Appl. No. 14/248,668.
Notice of Allowance dated Jun. 14, 2016 for U.S. Appl. No. 14/478,073.
Office Action dated Apr. 25, 2013 U.S. Appl. No. 13/430,015.
U.S. Appl. No. 13/046,891, filed Mar. 14, 2011, 35 pages.
Dahono, Pekik Argo. "A Control method for DC-DC Converter That Has an LCL Output Filter Based on New Virtual Capacitor and Resistor Concepts." 2004 35th Annual IEEE Power Electronics Specialists Conference. 7 pages.
DSI3 Bus Standard. Jul. 2, 2010, 46 pages.
PSI5 Peripheral Sensor Interface. Peripheral Sensor Interface for Automotive Applications, Aug. 17, 2011, 47 pages.
Wessels, Christian, et al. "Active Damping of LCL-Filter Resonance based on Virtual Resistor for PWM Rectifiers—Stability Analysis with Different Filter Parameters." Institute of Power Electronics and Electrical Drives Kaiserstr. 2, 24143 Kiel, Geramny, Jun. 15-18, 2008, 7 pages.
U.S. Appl. No. 13/212,463, filed Aug. 18, 2011, 23 pages.
U.S. Appl. No. 13/430,015, filed Mar. 26, 2012, 35 pages.
Infineon Technologies. "Differential Two-Wire Hall Effect Sensor IC." Published in Feb. 2002. 18 pages.
Discrete Semiconductors. "Rotational Speed Sensor for Extended Air Gap Application and Direction Detection." Published on Sep. 4, 2004, 16 pages.
Infineon Technologies. "TLE4941/4941C Smart Hall Effect ICs for Active Wheel Speed Sensing." Published in 2006, 2 pages.
U.S. Appl. No. 13/908,389, filed Jun. 3, 2013, 47 pages.
Micrel : MIC 184 Local/Remote Thermal Supervisor. Firmenschrift, Micrel, Inc : Data Sheet MIC 184, May 2006, San Jose: Micrel, 2006. 20 pages.
Haegglund, Tore : New Estimation techniques for Adaptive Control. Doctoral Dissertation, The Swedish Board for Technical Development (STU), Document No. CODEN : LUTFD2/(TFRT-1025)/1-120/(1983). Lund, Sweden : Lund University, Department of Automatic Control, Dec. 1983. 118 pages.
Office Action dated Jun. 26, 2013 U.S. Appl. No. 13/046,891.
Tietze, U., et al. "Electronic Circuits: Design and Application." ISBN 3-540-50608-X. Berlin, Heidelberg ; New York : Springer. Kapitel 23.6-23.8: AD-Umsetzer, S. Published in 1991. pp. 690-711.
Non Final Office Action dated Nov. 8, 2013 U.S. Appl. No. 13/430,015 , 22 pages.
Notice of Allowance dated Dec. 16, 2013 U.S. Appl. No. 13/046,891, 24 pages.
U.S. Appl. No. 14/248,668, filed Apr. 9, 2014.
Notice of Allowance dated Jun. 3, 2014 U.S. Appl. No. 13/430,015.
Non Final Office Action dated Jul. 16, 2014 U.S. Appl. No. 13/212,463.
Final Office Action dated Aug. 11, 2015 U.S. Appl. No. 13/908,389.

(56) References Cited

OTHER PUBLICATIONS

Non Final Office Action dated Feb. 18, 2015 U.S. Appl. No. 13/908,389.
DSI3, DSI3 Bus Standard Revision 1.00, Feb. 16, 2011, DSI.
Johnson, HART Communication Networks are Improved by Small, Flexible, Low-Power Modem ICs, Oct. 2012, Analog Dialogue.
Aragon, et al., Power Line impedance Characterization of Automotive Loads at the Power Line Comminication Frequency Range, 2010, MICINN.
U.S. Appl. No. 13/430,015, filed Mar. 26, 2012.
Notice of Allowance dated Nov. 20, 2014 U.S. Appl. No. 13/212,463.
Notice of Allowance dated May 11, 2015 U.S. Appl. No. 13/197,288.
Non Final Office Action dated Jun. 20, 2014 U.S. Appl. No. 13/197,288.
Final Office Action dated Jan. 16, 2015 U.S. Appl. No. 13/197,288.
U.S. Appl. No. 14/478,073, filed Sep. 5, 2015, 26 pages.

* cited by examiner

Response data bit encoding

Each symbol encodes four data bits

US 9,817,381 B2

SENSOR INTERFACE WITH VARIABLE CONTROL COEFFICIENTS

REFERENCE TO RELATED APPLICATION

This application is a continuation of U.S. application Ser. No. 13/197,288 filed on Aug. 3, 2011, the contents of which are incorporated by reference in their entirety.

BACKGROUND

Modern vehicles include a vast array of sensors, such as air bag sensors, tire pressure sensors, engine sensors, seat belt sensors, and many others. The engine sensors, for example, can provide data about the vehicle's engine cycle to an engine control unit (ECU). Based on the data from the engine sensors, the ECU can then make changes to the engine cycle (e.g., spark plug timing and/or fuel injection parameters) to optimize engine performance.

As the number of vehicular sensors increases, integration is becoming a serious challenge for automakers. For example, wires connecting an ECU to its corresponding engine sensors can be several meters long. These wires are a significant cost factor in automotive systems and contribute to the overall weight of the vehicle. Because of this, some conventional wiring interfaces, such as PSI5 and DSI for example, limit the number of wires to two lines. These interfaces can be used in automotive airbag sensors, power train systems, and non-standardized pulse width modulated (PWM) protocols of ABS wheel speed sensors, among others. Unfortunately, absent countermeasures, the inductances and capacitances of these wires can give rise to noise at a resonant frequency set by the inductances and capacitances of the wires.

In some conventional implementations, an RLC filter (which includes a resistor and an optional by-pass inductor in parallel with the resistor) may be arranged between an ECU and its corresponding sensors. This RLC filter can be designed to attenuate noise at the resonant frequency, thereby helping to improve the performance of the vehicular sensing system. Unfortunately, however, the resistor and inductor included in such an RLC filter consume power, add to the cost of the sensor system, and may cause a voltage drop thereover. In addition, because different vehicles may include different sensors and different lengths of wires (i.e., different inductances and capacitances), it is difficult to set a single RLC filter to adequately attenuate the different resonant frequencies corresponding to the different vehicles in conventional sensing systems.

Therefore, conventional approaches are less than ideal for several reasons, and the inventors have devised improved sensor interfaces as described further herein.

DETAILED DESCRIPTION

Figure 1:
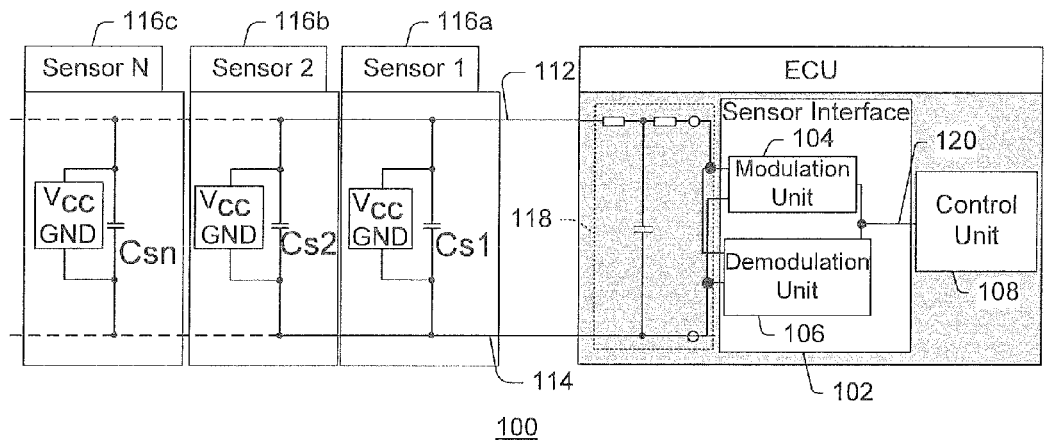
FIG. 1 is a block diagram of a vehicular sensing system in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

The present disclosure is directed towards a sensor interface module that delivers a supply voltage to a plurality of sensors, and which exchanges data signals between the plurality of sensors and a controller (e.g., an ECU). The sensor interface often employs a single-bit comparator (or a coarse analog to digital converter (ADC), e.g., a 2-bit or 3-bit ADC) to track signals to be exchanged between the sensors and controller over the sensor interface. Compared to power hungry ADC with more bits (e.g., 32 bit ADC), the single-bit comparator/coarse ADC limits hardware complexity and power consumption. In addition, in some embodiments the sensor interface module can include an estimator and/or assist comparators to speed up the tracking ability of the sensor interface module. In this way, techniques provided herein facilitate reliable, low-power communication between a controller (e.g., an ECU) and its corresponding sensors.

Turning now to FIG. 1, one can see a vehicular sensing system 100 that includes a sensor interface module 102 in accordance with some embodiments. The sensor interface module 102 includes modulation unit 104 and demodulation unit 106. On one side, the sensor interface module 102 has a control unit interface coupled to a control unit 108 (e.g., ECU); and on the other side, the sensor interface module 102 has a sensor interface coupled to a pair of wires 112, 114. The pair of wires are coupled to a number of sensors 116 (e.g., 116a, 116b, . . . 116c). To limit noise, an RC filter 118 is coupled to the sensor interface. In many embodiments, the RC filter 118 is devoid of discrete inductors and integrated inductors to reduce costs.

During operation, and when no data is to be exchanged, modulation unit 104 provides a supply voltage to the sensors 116 via the pair of wires 112, 114. This supply voltage is often a DC voltage used to power the sensors 116.

Figure 2:
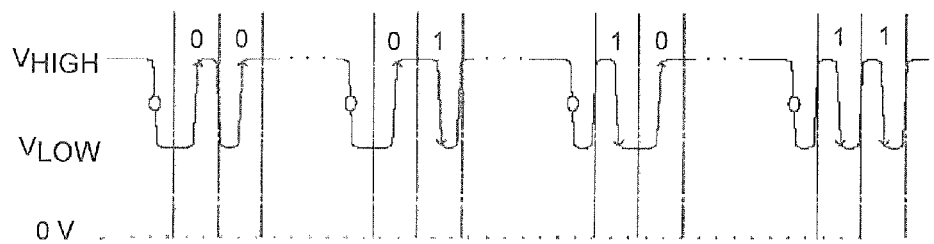
FIG. 2 is a waveform diagram of a modulated voltage signal that can be transmitted to sensors of a vehicular sensing system.

When information is to be transmitted to the sensors 116, the control unit 108 provides a first control signal on 120. Based on the first control signal, the modulation unit 104 modulates the supply voltage to deliver a modulated voltage signal to at least one of the sensors 116 via the pair of wires 112, 114. FIG. 2 shows one example of how this modulated voltage signal 200 can vary the supply voltage between a high supply voltage ($V_{HIGH}$) and a low supply voltage ($V_{LOW}$) to transmit information to the sensors 116. In FIG. 2's example, a rising edge voltage transition corresponds to a logical "0" and a falling edge voltage transition corresponds to a logical "1", but other encoding schemes could also be used.

Figure 3:
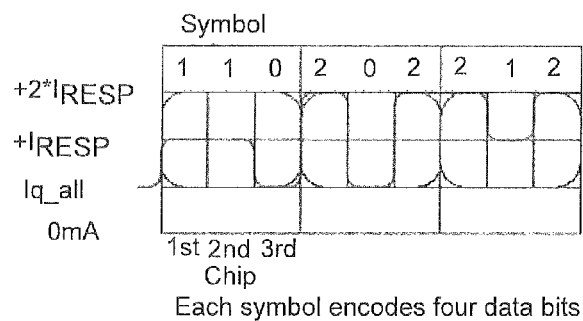
FIG. 3 is a waveform diagram of a modulated current signal that can be transmitted from a sensor of a vehicular sensing system.

To receive information from the sensors 116, the demodulation unit 106 decodes a modulated current signal received on the wires 112, 114, wherein the modulated current signal includes information from a transmitting sensor (e.g., 116a)

contained therein. FIG. 3 shows one example of a modulated current signal 300 that contains encoded data thereon as transmitted by a sensor. In FIG. 3's example, data bits can be encoded as symbols on the wires 112, 114, wherein each symbol is made up of three chips and encodes four data bits.

Figure 4:
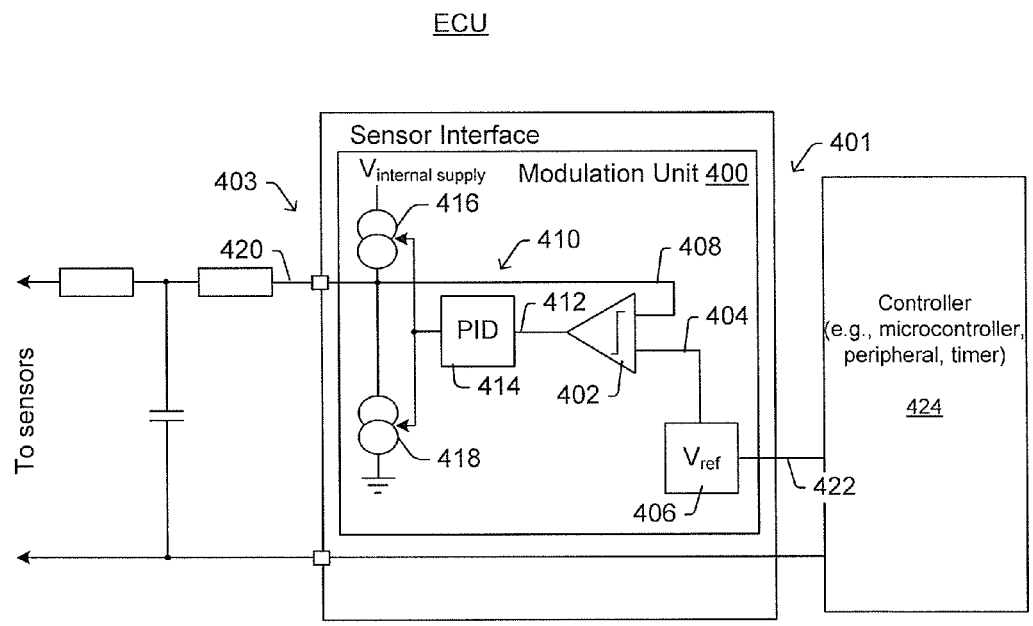
FIG. 4 is a block diagram of a sensor interface module in accordance with some embodiments.

FIG. 4 shows a more detailed view of a modulation unit 400 (e.g., modulation unit 104 of FIG. 1). On one side, the modulation unit 400 includes a control unit interface 401, which interfaces to a control unit 424. On the other side, the modulation unit 400 includes a sensor interface 403, which interfaces to the pair of wires coupled to the sensors. In short, the modulation unit 400 receives a first control signal on 422, and regulates its output voltage on output node 420 such that the output voltage tracks the first control signal 422, thereby transmitting the desired information to the sensors.

To limit power consumption, rather than using a power-hungry ADC with a large number of bits (e.g., 32 bit ADC), the modulation unit 400 includes a single-bit comparator 402 to output a single-bit error signal on 412, or which uses a coarse ADC to output an error signal having only a few bits (e.g., 2 or 3 bits) on 412. For the single-bit comparator 402, a first comparator input 404 is coupled to a supply voltage 406, and a second comparator input 408 is coupled to the output node 420 via a feedback path 410. The comparator output 412 is coupled to a PID controller 414, which is in turn coupled to first and second current sources 416, 418.

During operation, FIG. 4's modulation unit 400 can change its output voltage on output node 420 based on a first control signal 422 from controller 424. This first control signal on 422 sets a target voltage on the first comparator input 404. The comparator 402 then adjusts its error signal voltage level on 412 (which sets a second control signal output by the PID controller) until the modulation unit's output voltage on output node 420 matches the target voltage on 404. Even though the single bit comparator 402 potentially provides low-power performance and minimum chip area, however, the inventors have appreciated that unfortunately the single-bit comparator architecture is fraught with challenges. The sampling rate of the comparator 402 is typically high compared to the bandwidth of the PID controller 414. Thus, large difference between the output voltage and the target voltage cannot be compensated during a single clock cycle. Absent countermeasures, the limited bandwidth of the controller emphasizes the nonlinearities of the coarse quantized feedback path and lets the loop go into a slewing state. If this slewing is not finished fast enough it can prevent the sensor interface from tracking currents or voltages fast enough to accurately exchange data between controller 424 and its corresponding sensors.

To help facilitate use of a single-bit comparator (or coarse-bit ADC), some modulation units disclosed herein make use of an estimator block. For example, in FIG. 5, an estimator block 502 updates coefficients for the PID controller 414 based on a history of feedback on the feedback path 410. For example, when the comparator 402 is a single-bit comparator and the feedback path 410 is a single-bit feedback path, the estimator block 502 can receive a series of single bits from the feedback path 410 at different times, and then analyze the collective single bits to set the PID coefficients (e.g., $k_i$, $k_P$, $k_D$.) The estimator block 502 is also coupled to a protocol processor 504 to take into account whether information is to be transmitted to the sensors, received from the sensors, and whether the estimator 502 is in a startup mode.

Because large differences between the output voltage on 420 and the target voltage on 404 cannot be compensated during a single clock cycle, several consecutive feedback bits will have the same value for large differences. Consequently, the number of consecutive samples having the same sign gives a measure that is reciprocally related to the gain of the single bit comparator 402. This gain estimation principle allows the continuous increase of the PID coefficients unless the sign of the error signal on 412 switches.

Figure 5:
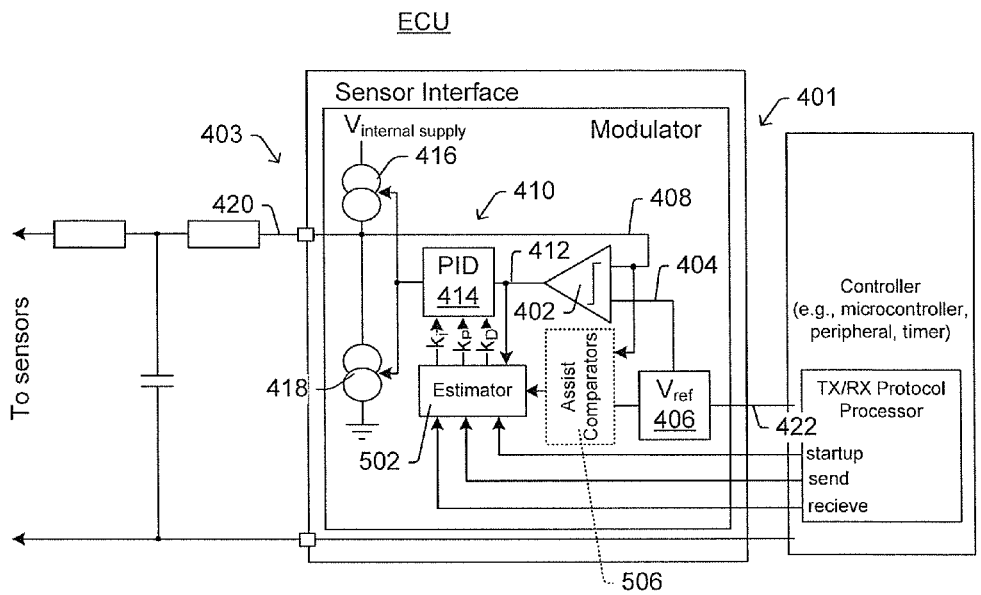
FIG. 5 is a block diagram of another sensor interface module in accordance with some embodiments.

FIG. 5 also shows how one or more optional, assist comparators 506 can be included in some modulation units. If present, these assist comparators 506 have respective reference voltages set at different trigger points. For example, if there are three assist comparators, they can have respective reference voltages at 50 mV (e.g. "large" deviation between target signal and output signal), 100 mV (e.g., "very large" deviation between target signal and output signal), and 200 mV (e.g., "excessive" deviation between target signal and output signal). These assist comparators 506 allow the sensor interface module to change control characteristics more rapidly than with a single bit comparator alone (e.g., for gain estimation based on an N-bit FIR filter, since it needs N steps to teach its maximum output value). In essence, the assist comparators 506 can each provide additional gain to help assist the single-bit comparator 402 when large changes in the output voltage are needed. Furthermore the assist comparators 506 can switch their outputs to deactivate the additional gain when the output approaches the target value again, which improves the ability to avoid overshoot or oscillation after slew transitions. These assist comparators 506 can be realized in extremely simple, chip-area saving and power saving manner, and are especially useful to react to electromagnetic injection. But for the assist comparators 506, electromagnetic injection can exceed the assist comparator threshold within very few clock cycles and requires a very fast proportional and differential response.

In considering how to set the PID coefficients, the estimator block 502 can account for the frequency of the error signal, as follows:

$K_i$ coefficient—the integral coefficient ($K_i$) is dominant at low frequencies (e.g., where the frequency of the error signal is less than a factor between 100 and 10,000 of the sample frequency ($f_s$)). Thus, $K_i$ is dominant for error signal frequencies of between below $f_s/10,000$ and $f_s/100$. Adaptation can be fast enough to use a relatively long FIR filter (e.g., 8 to 128 taps) for these frequencies.

$K_p$ coefficient—the proportional coefficient ($K_p$) is dominant at medium frequencies (e.g., the frequency of the error signal is between about $f_s/1000$ and $f_s/10$, which is typically the frequency range where most of the transmission spectrum is located. Adaptation can much faster for these medium frequencies (e.g., 2 to 16 taps), in order to recover fast enough before a zero crossing of the comparator input difference with a high $k_p$ setting leads to instability or even controlled oscillation with unnecessarily large amplitudes.

$K_d$ coefficient—the differential coefficient ($K_d$) is dominant at high frequencies (e.g., $f_s/100$ up to $f_s/2$). Adaptation in this case can be very fast for this component and the length of the FIR filter can be significantly shorter (e.g., 2 to 4 taps).

Figure 6:
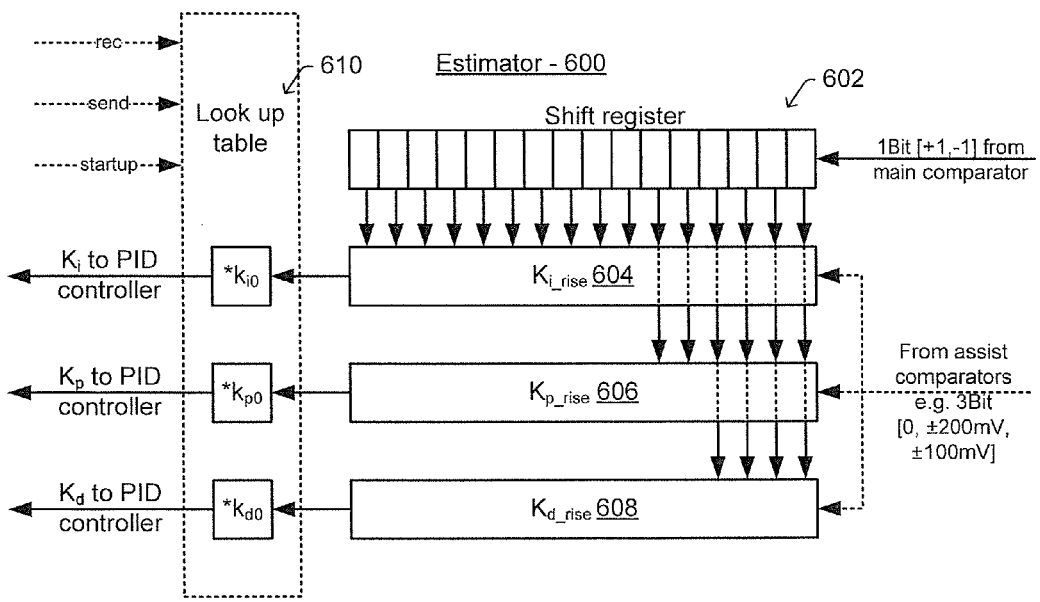
FIG. 6 is a block diagram of an estimator block in accordance with some embodiments.

FIG. 6 shows one embodiment of a more detailed estimator block 600 that makes use of these principles. In this embodiment, the estimator block 600 includes a shift register 602 coupled to the comparator (e.g., single bit comparator 402 in FIG. 5) and configured to store successive single-bit values from the comparator in time. Additional gain scaling registers (e.g., a $k_i$ register 604, a $k_p$ register 606, and a $k_d$ register 608) can also be included and can store values derived from a combination of the single-bit comparator and the assist comparators (e.g., assist comparators 504 in FIG. 5), if present. The estimator 600 also includes a look up table 610, or some other block that executes a nonlinear mathematical function, to select a control coefficient based on values stored in the gain scaling registers.

As can be seen, the most recent samples of the coarse quantizer stored in the shift register are used to set the $k_d$ coefficient. In contrast, additional older feedback samples out of the shift register are taken into account to set the $k_i$ coefficient. Intermediate feedback samples out of the shift register are used to set the $k_p$ coefficient.

A few non-limiting examples of how the coefficients can be calculated are set forth below:

$$k_{i\_rise} = \left| \sum_{v=0}^{n_i} S_{iv} \cdot s_{iv} \right| + \sum_{\mu=0}^{m_i} A_{i\mu} \cdot a_{i\mu}$$

with:
$k_i$ gain rise factor for the integral path of the PID controller
$n_i$ number of shift registers taken into account
$m_i$ number of used assist comparators
$s_{iv}$ v clock periods delayed bit from the shift register [+1 or −1]
$S_{iv}$ weight factor for $s_{iv}$
$a_{i\mu}$ output of the µ-th assist comparator [0 or 1]
$A_{i\mu}$ weight factor for $a_{i\mu}$ $$k_{d\_rise} = 1 + \left| \sum_{v=0}^{n_d} S_{dv} \cdot s_{dv} \right| \cdot \sum_{\mu=0}^{m_d} A_{d\mu} \cdot a_{d\mu}$$

with:
$k_{d\_rise}$ gain rise factor for the proportional path of the PID controller
$n_d$ number of shift registers taken into account
$m_d$ number of used assist comparators
$s_{dv}$ v clock periods delayed bit from the shift register [+1 or −1]
$S_{dv}$ weight factor for $s_{dv}$
$a_{d\mu}$ output of the µ-th assist comparator [0 or 1]
$A_{d\mu}$ weight factor for $a_{d\mu}$ In some situations, the integral coefficient $k_i$ can take the value 0 since it makes no sense to change the integral coefficient in cases where the error signal from the estimator indicates that that the voltage output is extremely close to the target voltage. This setup is extremely stable and helps to ensure the output value quickly approaches the target value after slewing.

Figure 7A:
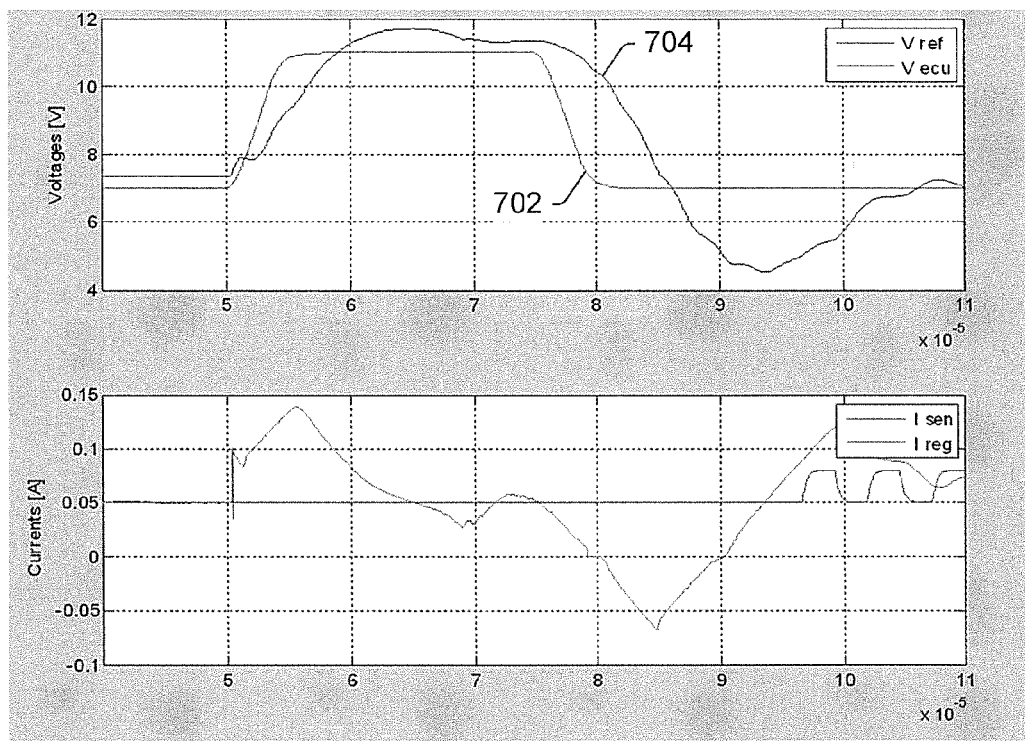
FIGS. 7A-7C are waveform diagrams of a modulated voltage signal and corresponding currents for various sensor interface modules.
Figure 7A:
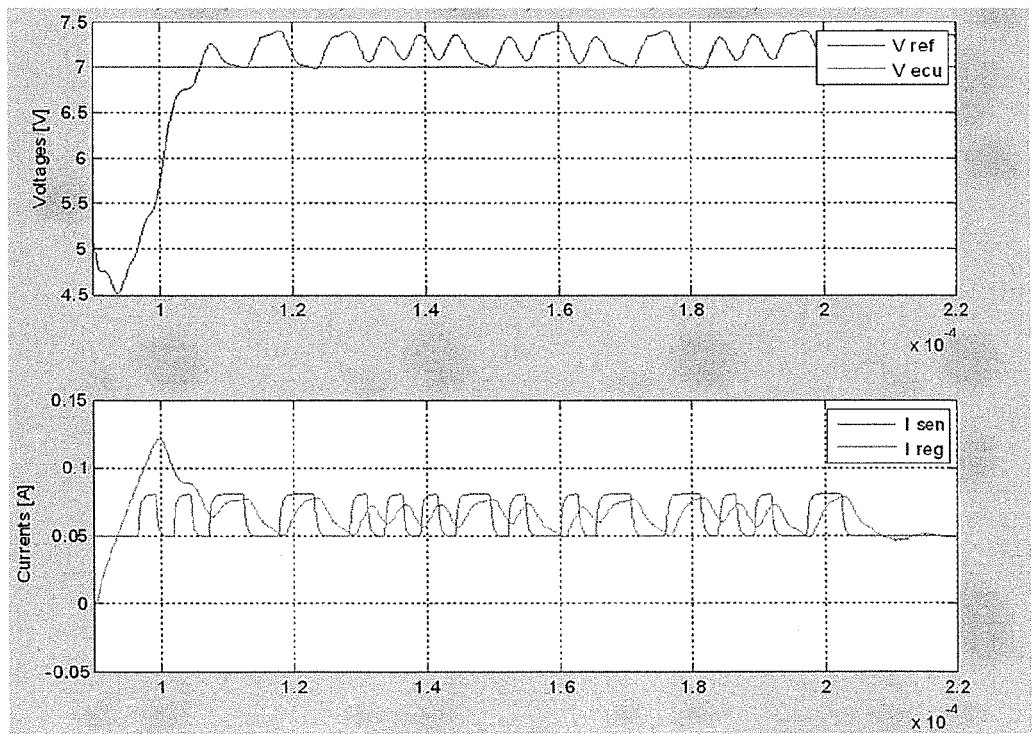
Figure 7B:
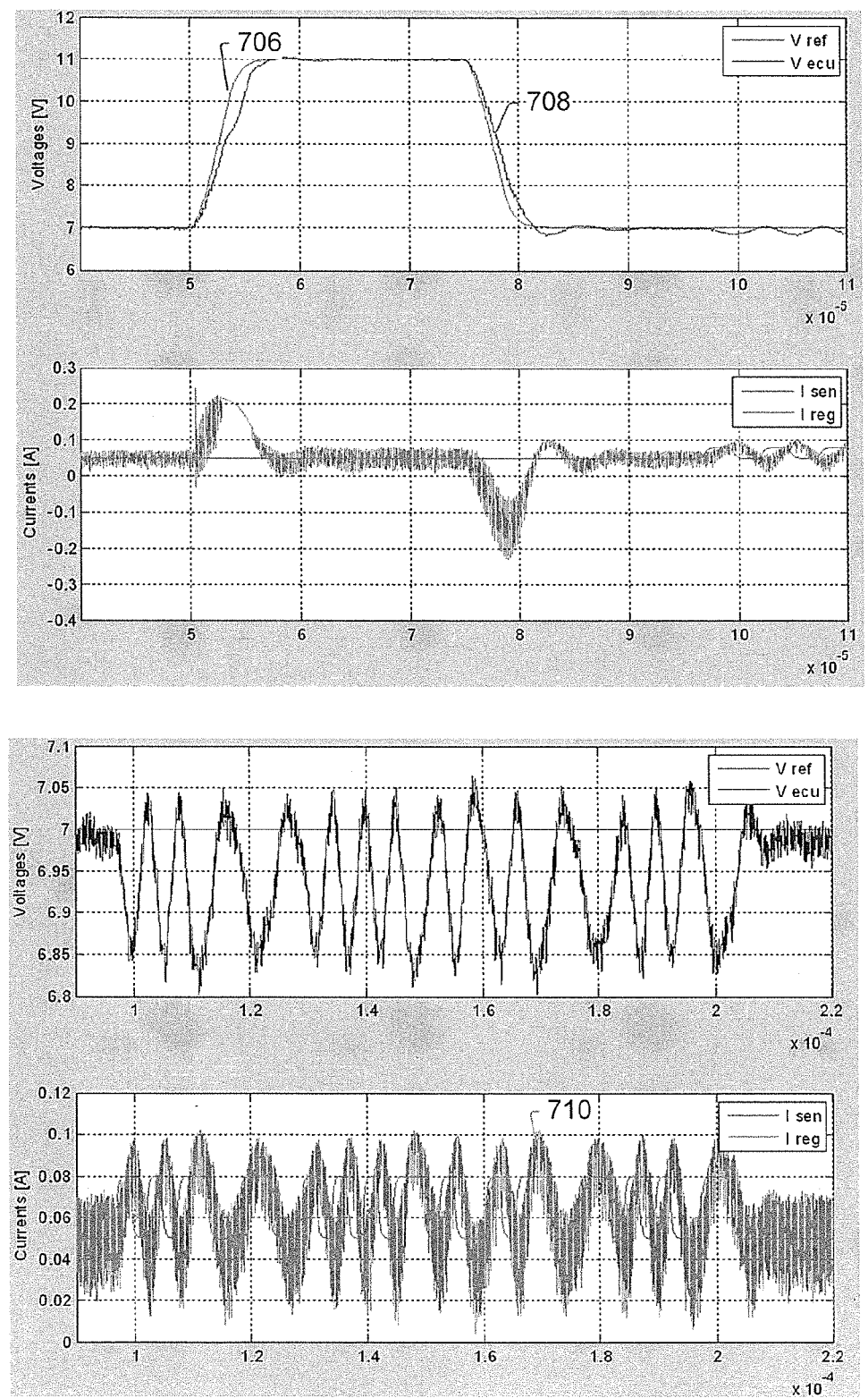
Figure 7C:
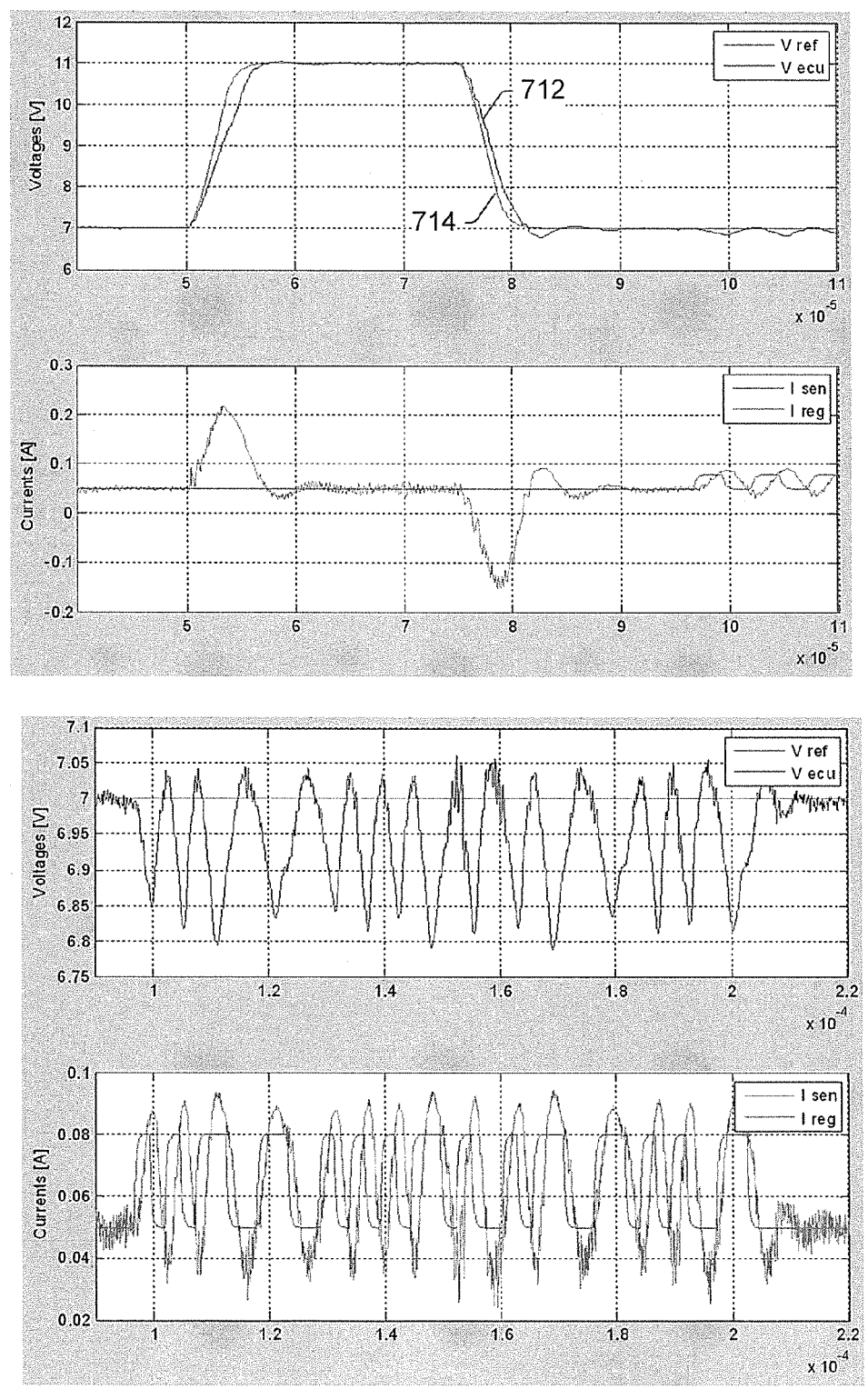

FIG. 7A-7C shows a series of simulation results as a series of waveforms. FIG. 7A shows circuit behavior of a sensor interface, which includes a single bit comparator without the use of an estimator to set PID coefficients. The upper plot in FIG. 7A shows two voltage curves as a sensor interface module attempts to transmit a PSI5 sync pulse to one or more sensors. A single-bit comparator within the sensor interface module receives a target voltage 702 from a control unit, wherein the target voltage 702 represents the sync pulse to be transmitted. The single-bit comparator measures the output voltage 704, and regulates its internal currents (lower portion of FIG. 7A) in an attempt to have the output voltage 704 track the target voltage 702. In FIG. 7A's example, the single-bit controller does not have enough gain to track the target voltage 702, and hence the output voltage 704 provided by the sensor interface does not track properly.

FIG. 7B shows circuit behavior of another sensor interface, which includes a single bit comparator without the use of an estimator to set PID coefficients. In this example, the single-bit controller is fast enough that the output voltage 708 adequately tracks the target voltage 706 (as shown in the upper plot of FIG. 7B). However, the single bit comparator architecture creates high frequency transients on the output voltage line as well as in the delivered output current 710. Both will create electromagnetic emission and should be avoided.

FIG. 7C shows circuit behavior of another sensor interface, which includes a single-bit comparator and an estimator. FIG. 7C shows that the single-bit comparator with estimator is fast enough that the output voltage 712 adequately tracks the target voltage 714 (as shown in the upper plot of FIG. 7C). In addition, the inclusion of the estimator also reduces unwanted high frequency current transients (as shown in lower portion of FIG. 7C). In this way, the sensor interfaces disclosed herein provide good tracking ability for sensor interfaces, while simultaneously providing low power consumption and a reduction in electromagnetic emission.

Although the disclosure has been shown and described with respect to one or more implementations, equivalent alterations and modifications will occur to others skilled in the art based upon a reading and understanding of this specification and the annexed drawings Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:
1. A sensor interface module comprising;
a control unit interface configured to be coupled to a control unit;

a supply voltage module coupled to the control unit through the control unit interface;

a single-bit comparator or coarse analog to digital converter (ADC) having a first comparator input coupled to the supply voltage module and having a second comparator input coupled to an output node of the sensor interface module via a feedback path;

a proportional integral (PI) controller having an input coupled to an output of the single-bit comparator or coarse ADC;

a primary estimator coupled to the feedback path, wherein the primary estimator is configured to determine coefficients for the PI controller based on a history of bits on the feedback path;

a plurality of assist comparators having different respective trigger points and configured to help determine the coefficients of the PI controller based on the history of bits on the feedback path; and a sensor interface coupled to the output node of the sensor interface module and configured to be coupled to a pair of wires which are coupled to a plurality of sensors.

2. The sensor interface module of claim 1, wherein the PI controller is configured to modulate an output voltage on the output node based on an error signal output by the single bit comparator or coarse ADC.

3. The sensor interface module of claim 2, wherein the error signal is less than four bits in length.

4. The sensor interface module of claim 1, further comprising:

first and second controllable current sources having respective input terminals coupled to an output of the PI controller and configured to cooperatively establish an output voltage on the output node of the sensor interface.

5. The sensor interface module of claim 2, wherein the error signal is a single bit in length.

6. A sensor interface module for transmitting a control signal from an engine control unit (ECU) over a pair of wires to one or more of a plurality of vehicular sensors, the sensor interface module comprising:

first and second controllable current sources arranged in series on a current path and having an output node disposed between the first and second controllable current sources, wherein the output node provides an actual voltage level and is configured to be coupled to a pair of wires which is in turn coupled to a plurality of vehicular sensors;

a comparator configured to provide an error signal indicative of a difference between the actual voltage level and a target voltage-level, wherein the target voltage-level is specified in the control signal from the ECU;

a proportional-integral (PI) controller configured to provide a current control signal to control terminals of the first and second controllable current sources based on the error signal and one or more PI coefficients; and an estimator configured to determine the one or more PI coefficients based on a history of bits in the error signal.

7. The sensor interface module of claim 6 further comprising:

a plurality of assist comparators having different respective trigger points and configured to help set the PI coefficients based on the history of bits.

8. The sensor interface module of claim 6, wherein the comparator is a single-bit comparator or a coarse analog-to-digital converter (ADC).

9. The sensor interface module of claim 6, wherein the estimator comprises:

a shift register coupled to the comparator and configured to store successive values of the error signal in time.

10. The sensor interface module of claim 9, wherein the estimator further comprises:

a look up table configured to select a coefficient for the PI controller based on the successive values of the error signal stored in the shift register.

11. The sensor interface module of claim 6, wherein the error signal is less than four bits in length.

12. The sensor interface module of claim 6, wherein the error signal is a single bit in length.

13. A sensor interface module for transmitting a control signal from an engine control unit (ECU) to one or more of a plurality of vehicular sensors over a pair of wires, the sensor interface module comprising:

first and second controllable current sources arranged in series on a current path and having an output node disposed between the first and second controllable current sources;

a voltage regulator configured to receive the control signal from the ECU and configured to monitor a voltage-level at the output node, the voltage regulator further configured to, based on the control signal and the monitored voltage-level, provide a current control signal to the first and second controllable current sources to adjust the voltage-level provided at the output node so as to track a target voltage-level indicated by the control signal and thereby transmit the control signal to the one or more of the plurality of vehicular sensors;

a comparator configured to provide an error signal indicative of a difference between the target voltage-level and the voltage-level at the output node; and a proportional-integral (Pl) controller configured to provide the current control signal based on Pl-coefficients that are set according to the error signal.

14. The sensor interface module of claim 13 further comprising:

an estimator configured to determine the PI coefficients based on a history of bits in the error signal; and a plurality of assist comparators having different respective trigger points and configured to help set the PI coefficients based on the history of bits.

15. The sensor interface module of claim 14, wherein the estimator comprises:

a shift register coupled to the comparator and configured to store successive values of the error signal in time; and a look up table configured to select a coefficient for the PI controller based on the successive values of the error signal stored in the shift register.

16. The sensor interface module of claim 14, wherein the error signal is less than four bits in length.

17. The sensor interface module of claim 14, wherein the error signal is a single bit in length.

18. The sensor interface module of claim 13, wherein the comparator is a single-bit comparator or a coarse analog-to-digital converter (ADC).

* * * * *